United States Patent
Itoh et al.

(10) Patent No.: US 6,464,130 B1
(45) Date of Patent: Oct. 15, 2002

(54) METHOD OF MANUFACTURING PIEZOELECTRIC ACTUATOR AND METHOD OF JOINING LEAD WIRE TO PIEZOELECTRIC ELEMENT OF PIEZOELECTRIC ACTUATOR

(75) Inventors: Hironobu Itoh, Chiba (JP); Keitaro Koroishi, Chiba (JP); Tomoyuki Yoshida, Chiba (JP)

(73) Assignee: Seiko Instruments Inc. (JP)

( * ) Notice: Subject to any disclaimer, the term of this patent is extended or adjusted under 35 U.S.C. 154(b) by 11 days.

(21) Appl. No.: 09/596,943

(22) Filed: Jun. 19, 2000

(51) Int. Cl.⁷ .......................... B23K 35/12; H01L 41/04
(52) U.S. Cl. .................. 228/245; 228/246; 228/33; 228/39; 228/41; 228/310; 228/358; 228/359; 228/366
(58) Field of Search ................ 29/25.35, 840; 228/245, 246, 256, 33–41; 310/358, 359, 366

(56) References Cited

U.S. PATENT DOCUMENTS

| | | | | |
|---|---|---|---|---|
| 3,717,742 A | * | 2/1973 | Fottler | 219/85 |
| 3,841,546 A | * | 10/1974 | Ozimec | 228/6 |
| 4,017,752 A | * | 4/1977 | Kakehi et al. | 310/9.4 |
| 4,350,918 A | * | 9/1982 | Sato | 310/367 |
| 4,845,399 A | * | 7/1989 | Yasuda et al. | 310/366 |
| 5,245,734 A | * | 9/1993 | Issartel | 29/25.35 |
| 5,265,316 A | * | 11/1993 | Ikeda et al. | 29/25.35 |
| 5,325,012 A | * | 6/1994 | Sato et al. | 228/121 |
| 5,477,102 A | * | 12/1995 | Miyoshi | 310/328 |
| 5,479,684 A | * | 1/1996 | Murphy | 29/25.35 |
| 5,639,508 A | * | 6/1997 | Okawa et al. | 29/25.35 |
| 5,750,199 A | * | 5/1998 | Sakemi | 427/357 |
| 6,194,816 B1 | * | 2/2001 | Wakabayashi et al. | 310/348 |
| 6,327,120 B1 | * | 12/2001 | Koganezawa et al. | 310/311 |

FOREIGN PATENT DOCUMENTS

| JP | 11-186850 A | * | 7/1999 | 228/245 |
|---|---|---|---|---|
| JP | 2001-57786 A | * | 2/2001 | 228/245 |

* cited by examiner

Primary Examiner—Tom Dunn
Assistant Examiner—L. Edmondson
(74) Attorney, Agent, or Firm—Adams & Wilks

(57) ABSTRACT

A method is provided for manufacturing a piezoelectric actuator having a piezoelectric element and a lead wire for supplying a drive signal to the piezoelectric element. A melt material is immersed into a fusing agent. A quantity of the material and the fusing agent is supplied to a transfer plate and then adjusted. A preselected quantity of the melt material and the fusing agent is then transferred preselected quantity of the melt material and the fusing agent is supplied from the transfer tool to the lead wire. The melt material is then welded on the lead wire and on the piezoelectric element to thereby connect the lead wire to the piezoelectric element.

23 Claims, 7 Drawing Sheets

Fig. 4
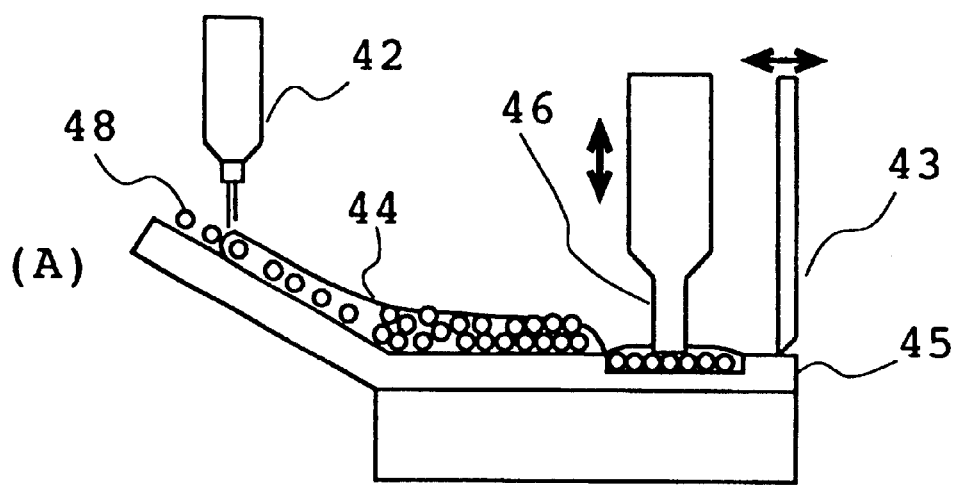
(A)
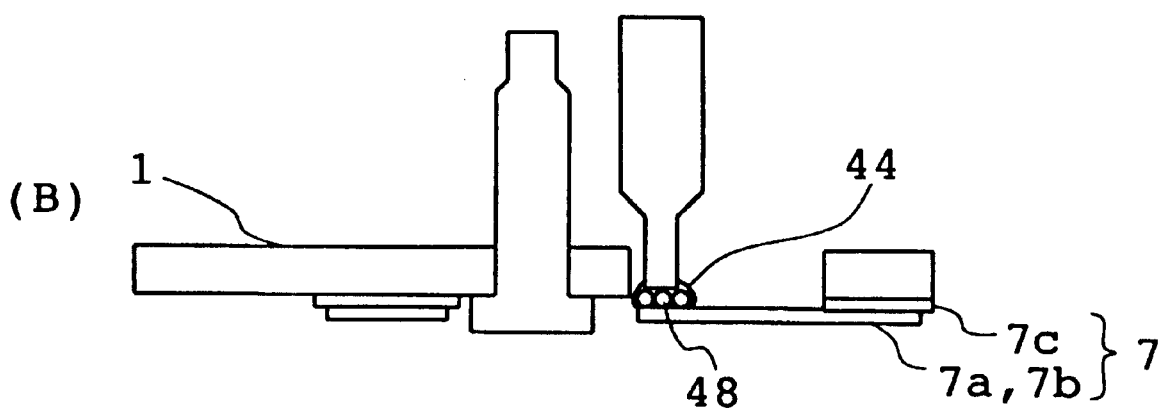
(B)
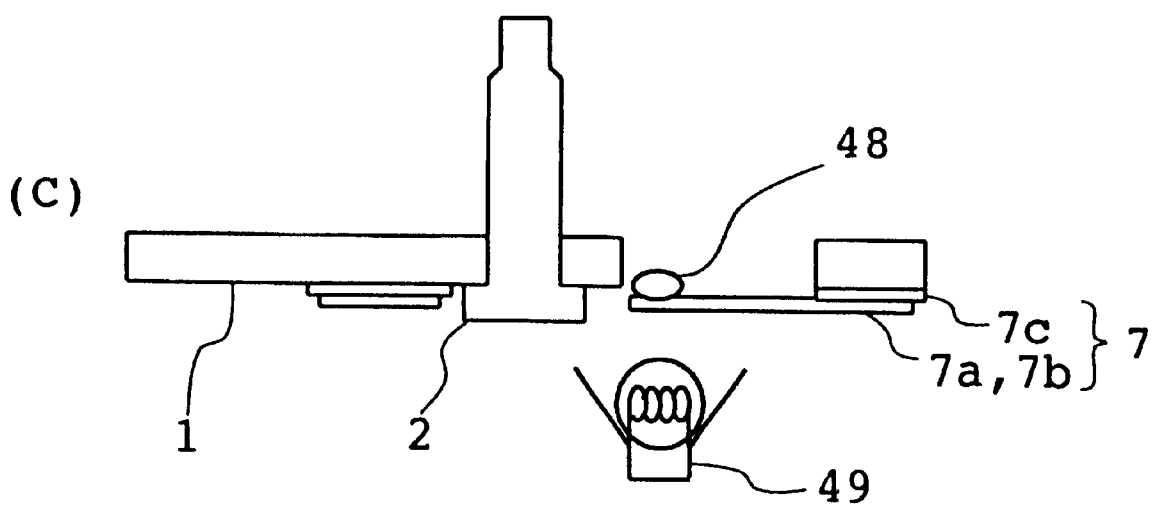
(C)

METHOD OF MANUFACTURING PIEZOELECTRIC ACTUATOR AND METHOD OF JOINING LEAD WIRE TO PIEZOELECTRIC ELEMENT OF PIEZOELECTRIC ACTUATOR

BACKGROUND OF THE INVENTION

1. Field of the Invention

The present invention relates to an improvement of a piezoelectric actuator in which a piezoelectric element and a lead wire for supplying a drive signal to the piezoelectric element are joined.

2. Description of the Related Art

Recently, a piezoelectric actuator which obtains a drive force by utilizing a piezoelectric effect of a piezoelectric element has been attracting attention in the field of microactuators.

The piezoelectric actuator heretofore comprises, as shown in FIG. 7, a support 71 having a central hole 71a and a conductive wire through hole 71b, a support shaft 72 disposed in the support 71, a resilient body 74 fixed to the support shaft 72 and having a protrusion 74a, a piezoelectric element 75 joined to a surface of the resilient body 74 in one direction, and a lead wire 77 for supplying an excitation signal, with one end thereof being connected to the piezoelectric element 75. Here, the piezoelectric element 75 has an electrode pattern 76 formed in a thin film and is joined to the resilient body 74 to constitute an oscillating body 73. The lead wire 77 has a base material 77c and conductive wires 77a, 77b disposed on the base material. Moreover, the lead wire 77 is joined thereto by plating a tin-lead solder thereon to form a junction layer 78 beforehand, pressing the lead wire 77 and the piezoelectric element 75 to bring them into contact with each other and applying heat.

However, it is necessary that the above-described lead wire 77 be firmly joined in the junction layer 78 with the piezoelectric element 75 to secure an adhesion strength, thereby causing a problem in that if the joining rear is increased, it interferes with oscillation of the oscillating body 73. This is due to the principle that the oscillation of the oscillating body 73 caused at the time of driving the piezoelectric actuator is smallest in the vicinity of the support shaft 72, and as the joining rear expands in the peripheral direction, or the joined position shifts outward, even a lead wire 77 having a low rigidity interferes with the oscillation.

Moreover, in the joining step, since a solder material flows out along the lead wire at the time of heating the solder to increase the joining area, it is necessary to set the heating conditions, taking the outflow of the solder into consideration. However, since it is difficult to control the outflow volume of the solder, there is a problem in that poor joining strength due to a small joining area and poor oscillation characteristic due to a large joining area are caused, to thereby decrease the yield rate. Furthermore, variations in the joining positions of the lead wire 77 causes a problem such as a poor oscillation characteristic and decrease in the yield rate.

SUMMARY OF THE INVENTION

It is, therefore, an object of the present invention to provide a piezoelectric actuator which reduces variations in the joining areas and the joining positions of a lead wire and a piezoelectric element, and maintains the oscillation characteristic, as well as improving the yield rate by securing a proper joining strength in the joining step of the piezoelectric element and the lead wire.

Specifically, in order to solve the above problems, a first aspect of the present invention is a piezoelectric actuator obtained by joining a piezoelectric element having an electrode formed thereon and a lead wire for supplying a drive signal to the piezoelectric element, having a melt material, at the junction portion of the electrode of the piezoelectric element and the lead wire, in a substantially spherical shape for being welded on respective materials.

Here, the lead wire is constituted of a conductive wire, or by firmly fixing a conductive wire and a nonconductive base material, and the conductive wire includes aluminum, copper, silver, gold or an alloy of these. The nonconductive base material includes, for example, polyimide resin, silicon resin, polyethylene resin, and epoxy resin mixed with glass fibers. The conductive wire and the nonconductive base material can be produced by adhesion, electroforming, printing or the like. Moreover, the melt material can be produced by processing a tin-lead solder having a different composition ratio of, for example, 6:4 or 9:1, tin alloy, tin, copper, aluminum, nickel or the like into a substantially spherical body, a cubic body, a cylindrical body or the like.

In this way, the melt material which is arranged in the junction portion of the piezoelectric element and the lead wire becomes a substantially spherical body due to heating at the time of joining, and becomes a spherical body collapsed in the pressing direction, that is in the thickness direction due to the application of pressure at the time of joining. If the diameter of the melt material extending along the piezoelectric element and the lead wire and the width of the lead wire are multiplied, the joining area can be easily calculated. FIG. 6 is a graph showing the increase quantity of the diameter when the substantially spherical melt material is collapsed due to the application of pressure at the time of joining. The X-axis denotes a collapsed quantity in the thickness direction of the melt material, assuming a diameter of the melt material before application of pressure to be 1, and the Y-axis denotes an increase quantity thereof expanding along the piezoelectric element and the lead wire. Here, if a substantially spherical melt material is used, as shown in FIG. 6, the collapsed quantity in the thickness direction changes depending upon the pressurizing conditions at the time of joining. For example, if the melt material is collapsed up to 1/10 of the diameter (X-axis: 0.1), the junction length can be calculated as about five times the diameter (Y-axis). Therefore, control of the joining area becomes easy by processing the size of the melt material beforehand so as not to suppress the oscillation characteristic. Moreover, in the step of joining the piezoelectric element and the lead wire, a proper junction strength can be secured by measuring the diameter of the melt material after being joined, and reflecting the measurement in the joining conditions such as welding pressure or the like.

Furthermore, a second aspect of the present invention is a production method of a piezoelectric actuator obtained by joining a piezoelectric element having an electrode formed thereon and a lead wire for supplying a drive signal to the piezoelectric element, characterized by having steps of: supplying a melt material to the lead wire; welding the melt material on the lead wire; and welding the melt material on the piezoelectric element.

Here, the melt material can be obtained by processing a tin-lead solder having a different composition ratio of, for example, 6:4 or 9:1, tin alloy, tin, copper, aluminum, nickel or the like into a desired shape.

As a result, positioning of the melt material at a proper position on the lead wire becomes possible, by welding the lead wire and the melt material, immediately after the melt material is supplied to the lead wire. Therefore, variations in the joining position of the piezoelectric element and the lead wire are reduced, thereby improving the yield rate.

Moreover, the production method is characterized by using a melt material having a substantially spherical shape as the melt material.

As a result, in the step of welding the substantially spherical melt material on the lead wire and the piezoelectric element, the melt material joins the lead wire and the piezoelectric element, while maintaining the substantially spherical shape. That is to say, the melt material does not flow out along the lead wire, and the joining area is stable, thereby improving the yield rate.

Furthermore, in the step of supplying the melt material to the lead wire, there is also a step of immersing the melt material in a fusing agent and supplying the melt material to a transfer plate, a step of transferring the melt material from the transfer plate to a transfer tool, and a step of transferring the melt material from the transfer tool to the lead wire.

Here, the fusing agent contains an acid or alkaline aqueous solution, or an organic solvent.

As a result, it becomes possible to supply a minute amount of melt material to the lead wire. Also, by supplying a proper number of melt materials to the transfer plate and then transferring these to the lead wire using the transfer tool, the quantity of melt material supplied to the lead wire can be controlled.

Moreover, a production method of a piezoelectric actuator obtained by joining a piezoelectric element having an electrode formed thereon and a lead wire for supplying a drive signal to the piezoelectric element is characterized by having steps of: immersing a melt material in a fusing agent and supplying the melt material and the fusing agent to a transfer plate; transferring the melt material and the fusing agent from the transfer plate to a transfer tool; supplying the melt material and the fusing agent from the transfer tool to the lead wire; and welding the melt material on the lead wire and the piezoelectric element.

In this way, minute melt material can be easily supplied to the lead wire, and the melt material can be formed in a substantially spherical shape by heat for joining the lead wire and the piezoelectric element.

BRIEF DESCRIPTION OF THE DRAWINGS

FIG. 4 is a block diagram showing supplying and fusing steps of a melt material according to a production method of a piezoelectric actuator to which the present invention is applied.

DETAILED DESCRIPTION OF THE PREFERRED EMBODIMENTS

Embodiments according to the present invention will now be described in detail, with reference to FIG. 1 to FIG. 5.

At first, the structure of the piezoelectric actuator will be described.

Figure 1:
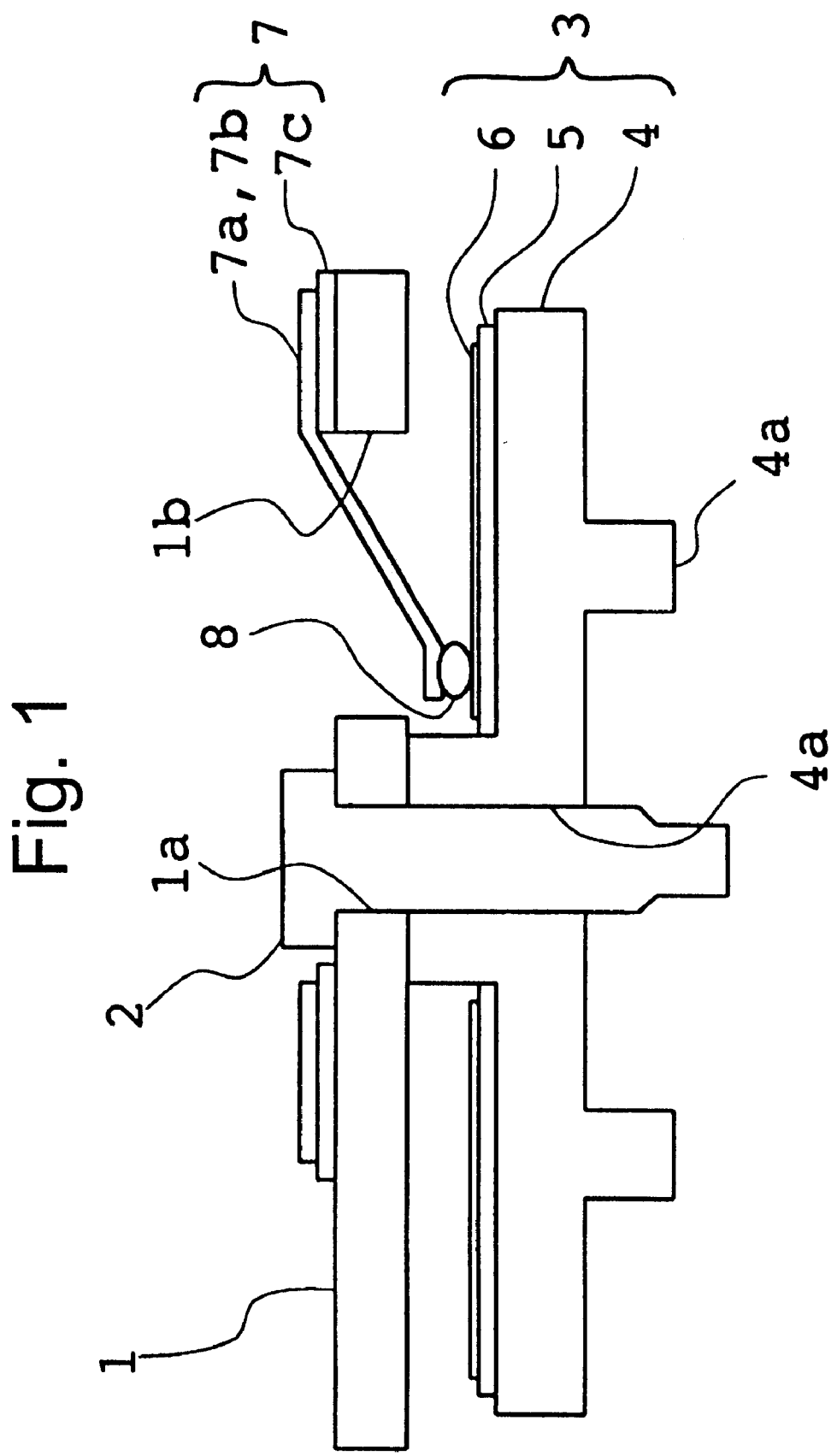
FIG. 1 is a schematic diagram showing a sectional structure of a piezoelectric actuator according to one embodiment applying the present invention.
Figure 2:
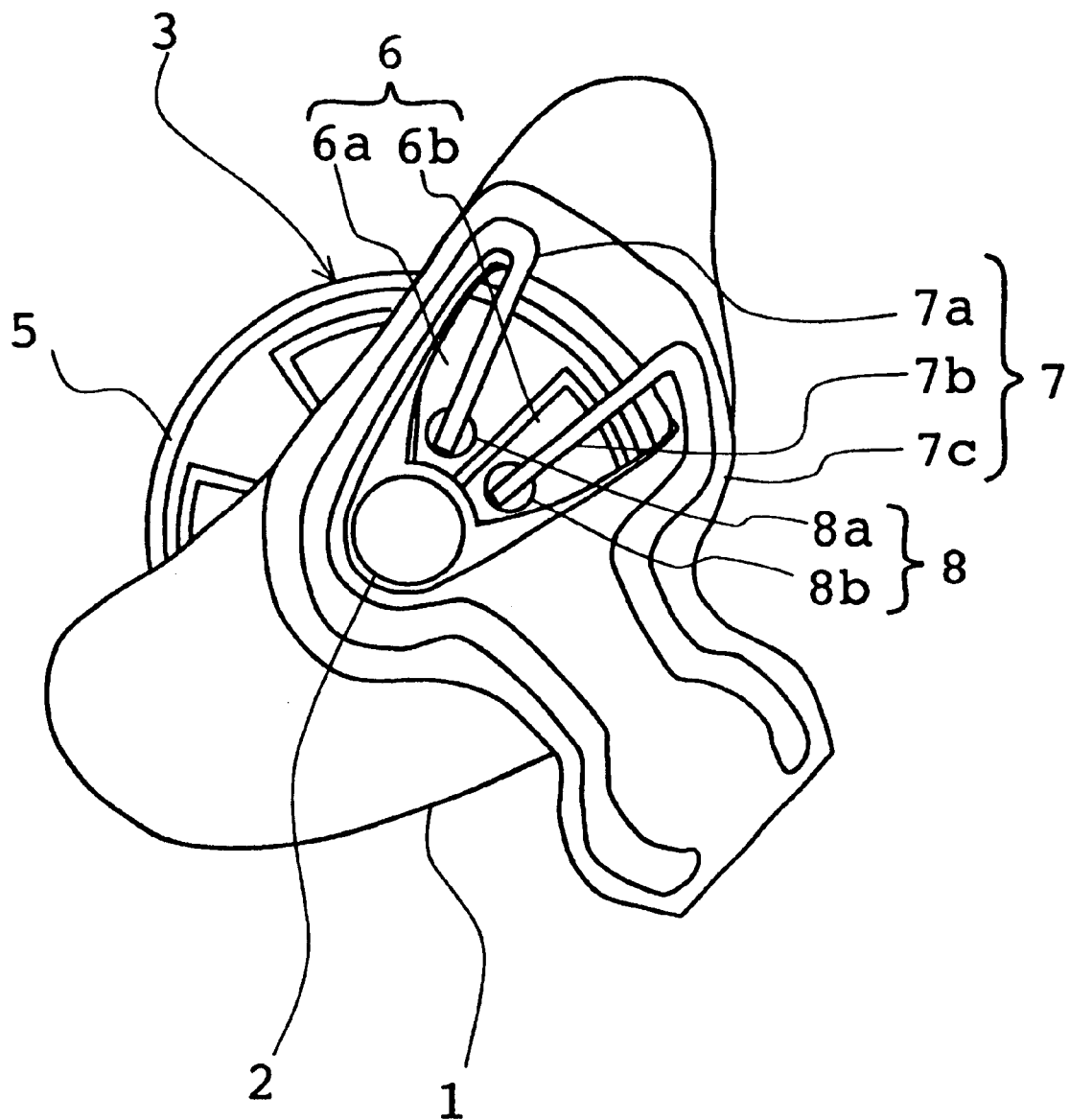
FIG. 2 is a schematic diagram showing in a plan view a structure of a piezoelectric actuator in FIG. 1, observed from the lead wire side.

FIG. 1 is a diagram showing a sectional structure of a piezoelectric actuator according to one embodiment applying the present invention, and FIG. 2 is a diagram showing a structure of the piezoelectric actuator in a plan view.

The piezoelectric actuator comprises a support 1, a support shaft 2 of the present invention fixed to the support 1, an oscillating body 3 fixed to the support shaft 2, a lead wire 7 joined to the support 1 on the face opposite to the oscillating body 3, and a melt material 8 for welding the lead wire 7 and the oscillating body 3.

Here, the support 1 is a flat body formed in a predetermined shape, and is provided with a central hole 1a for inserting the support shaft 2, and a conductive wire through hole 1b for passing a lead wire 7 through to the oscillating body 3 side.

The support shaft 2 is a cylindrical body formed by using a rigid material, and supports the oscillating body 3.

The oscillating body 3 comprises a resilient body 4, a piezoelectric element 5 joined to the resilient body 4, and an electrode pattern 6 formed on the surface of the piezoelectric element 5.

In detail, the resilient body 4 is formed in a disk shape corresponding to the piezoelectric element 5, and as the material thereof, a resilient material, for example, aluminum alloy, stainless steel, brass or the like is used. A pillar shaped protrusion 4a is also provided at a position corresponding to the boundary of divided portions of the electrode pattern 6 formed on the surface of the piezoelectric element 5, described later. A support shaft hole 4b is also provided for inserting the support shaft 2.

The piezoelectric element is a disk formed by using, for example, lead zirconate titanate, barium titanate, lead titanate, lithium niobate, lithium tantalate or the like. In addition, the electrode pattern 6 formed in the piezoelectric element 5 is equally divided into twelve.

Moreover, every other divided portion is short-circuit wired using a conductive thin film, similarly to the electrode pattern 6 which is film-formed with the inner periphery and the outer periphery of the piezoelectric element 5, to prepare two sets of electrode patterns, out of the electrode patterns equally divided into twelve. Drive signals in the clockwise direction can be input by joining a first electrode pattern 6a and a first conductive wire 7a, and drive signals in the counterclockwise direction can be input by joining a second electrode pattern 6b and a second conductive wire 7b. Furthermore, before the short-circuit wiring is performed with the conductive thin film, the electrode patterns equally divided into twelve are subjected to polarization processing, respectively, in predetermined directions.

The electrode pattern 6 is formed on the surface of the piezoelectric element 5 by means of vapor deposition, PVD, printing or the like of metals such as chromium, nickel, gold, copper, aluminum or the like.

The lead wire 7 comprises a base material 7c which is a film body formed in a predetermined shape by using polyimide, and is provided with conductive wires 7a, 7b extending from the base material 7c.

As the melt material 8, one obtained by processing a tin-lead solder having a composition ratio of, for example, 6:4 or 9:1, tin alloy, tin, copper, aluminum, nickel or the like into a spherical shape is used to weld the conductive wires 7a, 7b and the electrode pattern 6 provided on the piezoelectric element 5. The melt material 8 after welding becomes a substantially spherical shape, as shown in FIG. 1 and FIG. 2, due to heating and application of pressure at the time of welding.

According to the construction described above, the electrode patterns 6a, 6b provided on the piezoelectric element 5 and the conductive wires 7a, 7b serve to secure a proper adhesion strength by means of the melt materials 8a, 8b, and to secure a joining area that does not disturb the oscillation of the oscillating body 3, by reducing variations in the size of the melt materials.

Next a description will be given of a production method of the piezoelectric actuator according to an embodiment applying the present invention.

The production method of the piezoelectric actuator comprises steps of: supplying a melt material 8 to a lead wire 7; welding the melt material 8 on the lead wire 7; and welding the melt material 8 on a piezoelectric element 5. These steps will now be described in detail.

Figure 3:
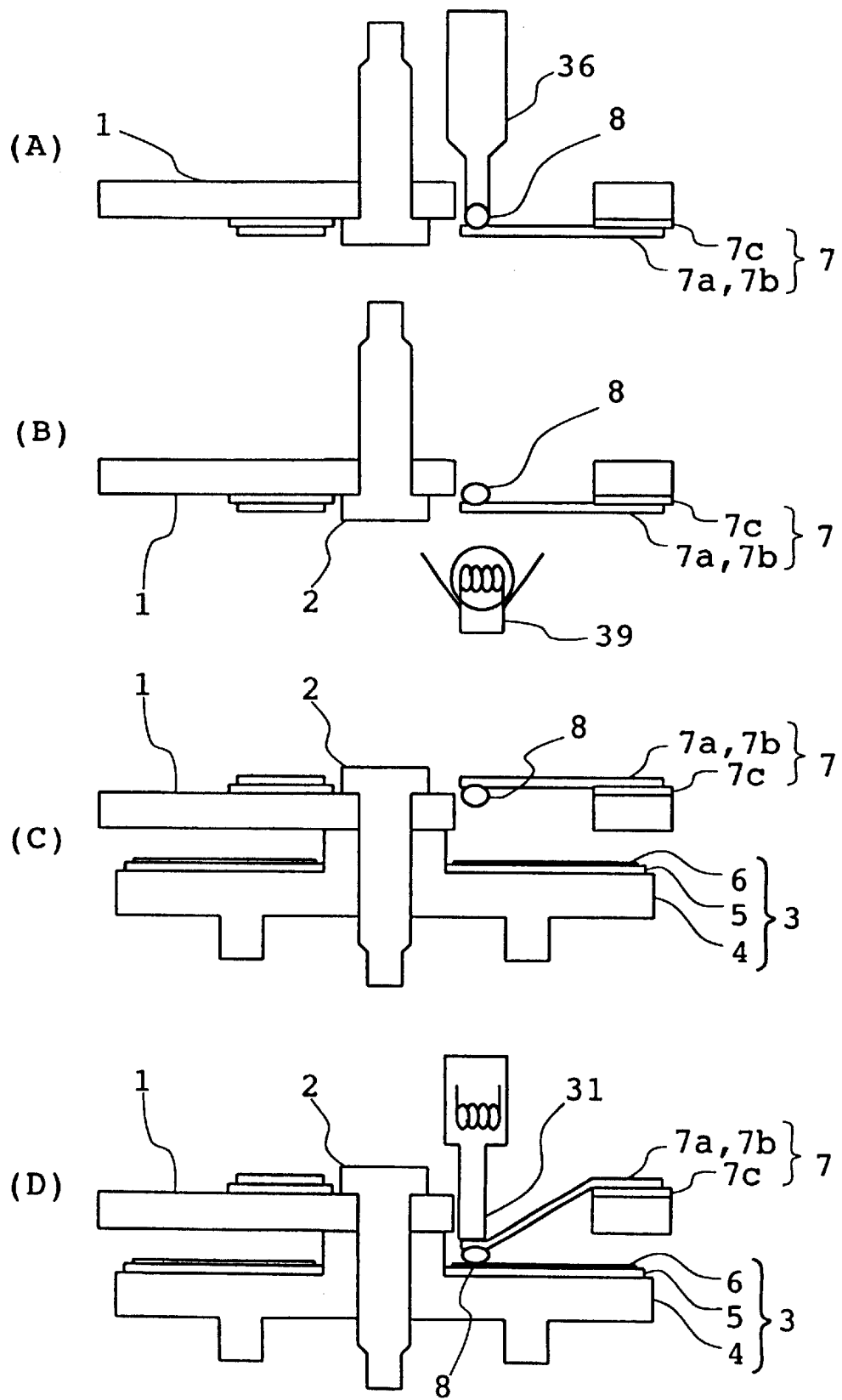
FIG. 3 is a block diagram showing a joining step of a piezoelectric element and a lead wire, according to a production method of a piezoelectric actuator to which the present invention is applied.

FIG. 3 is a block diagram showing a step of joining the piezoelectric element 5 and the lead wire 7.

In FIG. 3, the melt materials 8 are held in two positions of two conductive wires 7a, 7b of the lead wire 7 formed on a TAB (Tape Automated Bonding), by means of a chucking mechanism 36 for vacuum attaching and holding a melt material supply tool 38, to thereby supply one melt material each to the respective conductive wires 7a, 7b (FIG. 3(A)). Then, the conductive wires 7a, 7b are heated by an infrared ray lamp 39 to weld the melt materials 8a, 8b (FIG. 3(B)).

Then, after a step of press-fitting the support shaft 2 into the oscillating body 3 (FIG. 3(C)), the conductive wires 7a, 7b and the electrode patterns 6a, 6b are brought close to each other and heated by a heating tool 31, to thereby weld the electrode patterns 6a, 6b and the melt materials 8a, 8b (FIG. 3(D)).

As described above, immediately after the melt material 8 is supplied to the conductive wires 7a, 7b, it is heated and welded on the conductive wires 7a, 7b. As a result, falling off of the melt materials 8a, 8b can be prevented during transportation to the next step after the melt materials 8a, 8b are supplied, and in the step of press-fitting the oscillating body 3 into the support shaft 2 (FIG. 3(C)), as in this embodiment.

With this embodiment, as the melt materials 8a, 8b supplied to the conductive wires 7a, 7b, a solder material in a substantially spherical shape is used. When the conductive wires 7a, 7b are heated by the infrared ray lamp 39, the melt materials 8a, 8b flow slightly out onto the conductive wires 7a, 7b under conditions of a temperature of 200° C. and a time of 0.5 seconds, and welded as shown in FIG. 3(B). The shape of the melt material is affected by the surface tension at the time of melting. Even when a melt material in a cubic or cylindrical shape is used, after being welded on the conductive wire, the melt material becomes a substantially spherical shape due to the surface tension of the melt material. When a melt material in a cubic or cylindrical shape is used, however, such a problem easily occurs that the melt material flows out onto the conductive wire, flows down, or the like.

Therefore, it is advantageous to use the melt material in a substantially spherical shape, in view of variations in the heating conditions.

Supply of the melt material and the melting step will now be described.

Figure 5:
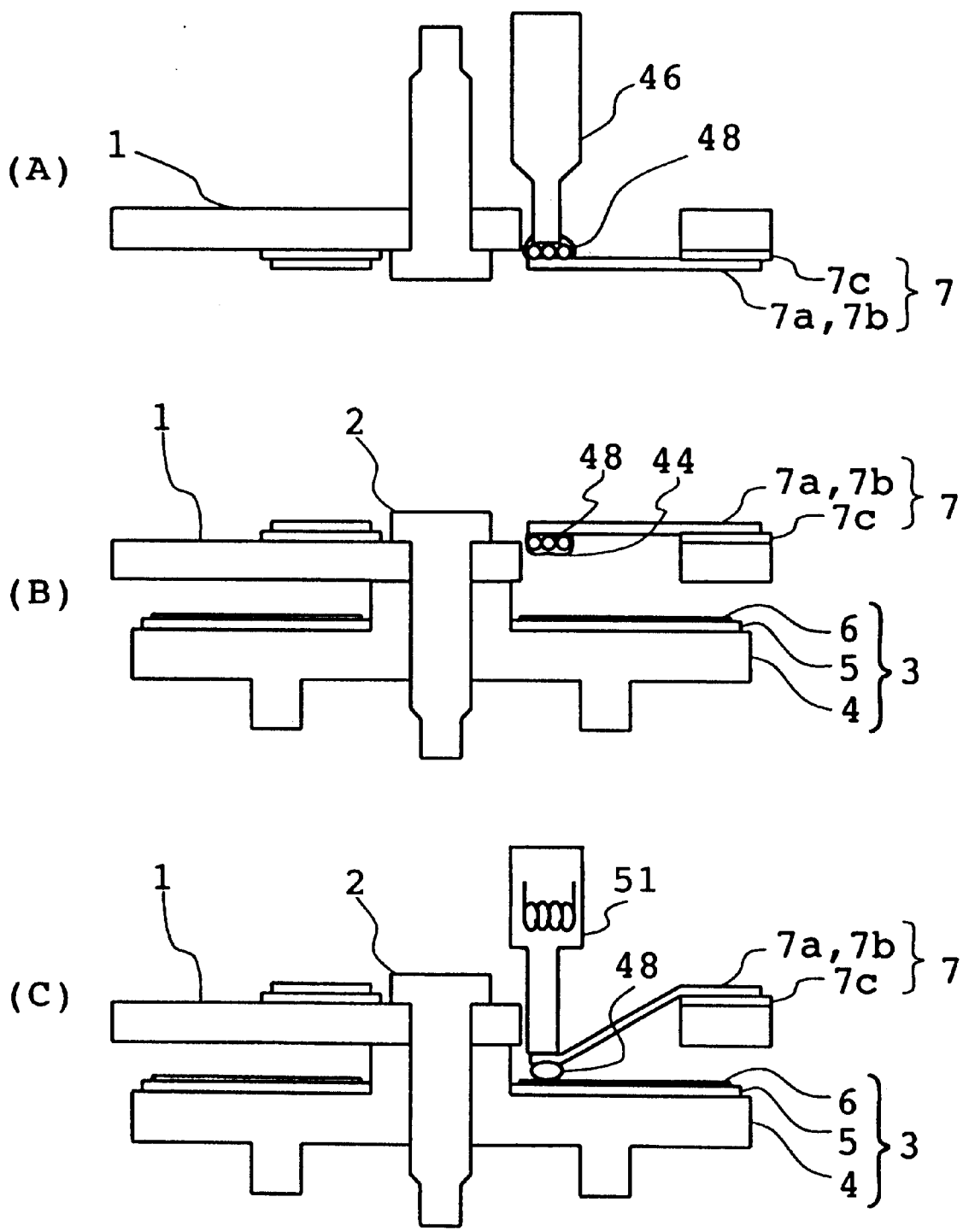
FIG. 5 is a block diagram showing supplying and fusing steps of a melt material according to a production method of a piezoelectric actuator to which the present invention is applied.
Figure 6:
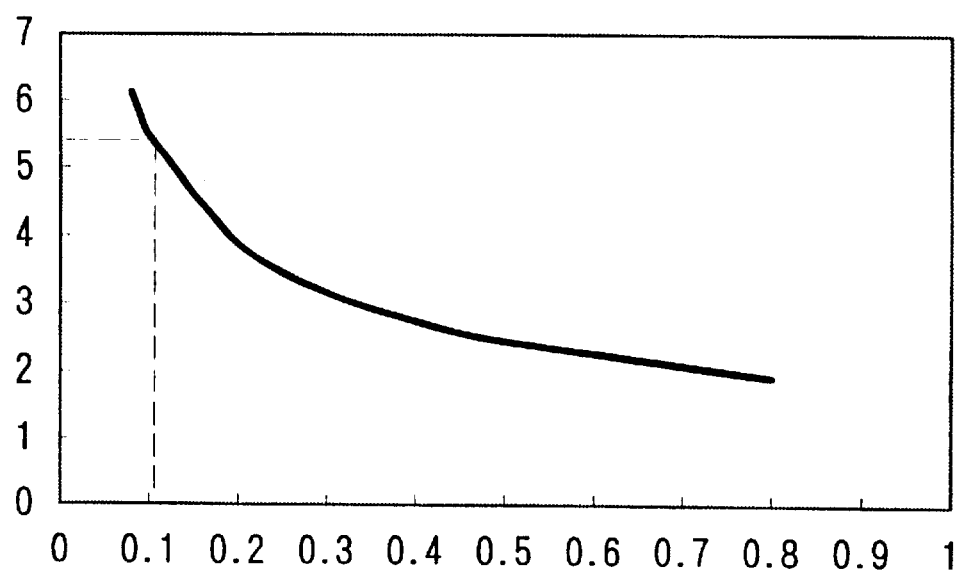
FIG. 6 is a schematic diagram showing an increase in diameter, when a melt material in a substantially spherical shape is collapsed due to application of pressure at the time of joining, with regard to the joining portion of a piezoelectric element and a lead wire, to which the present invention is applied.
Figure 7:
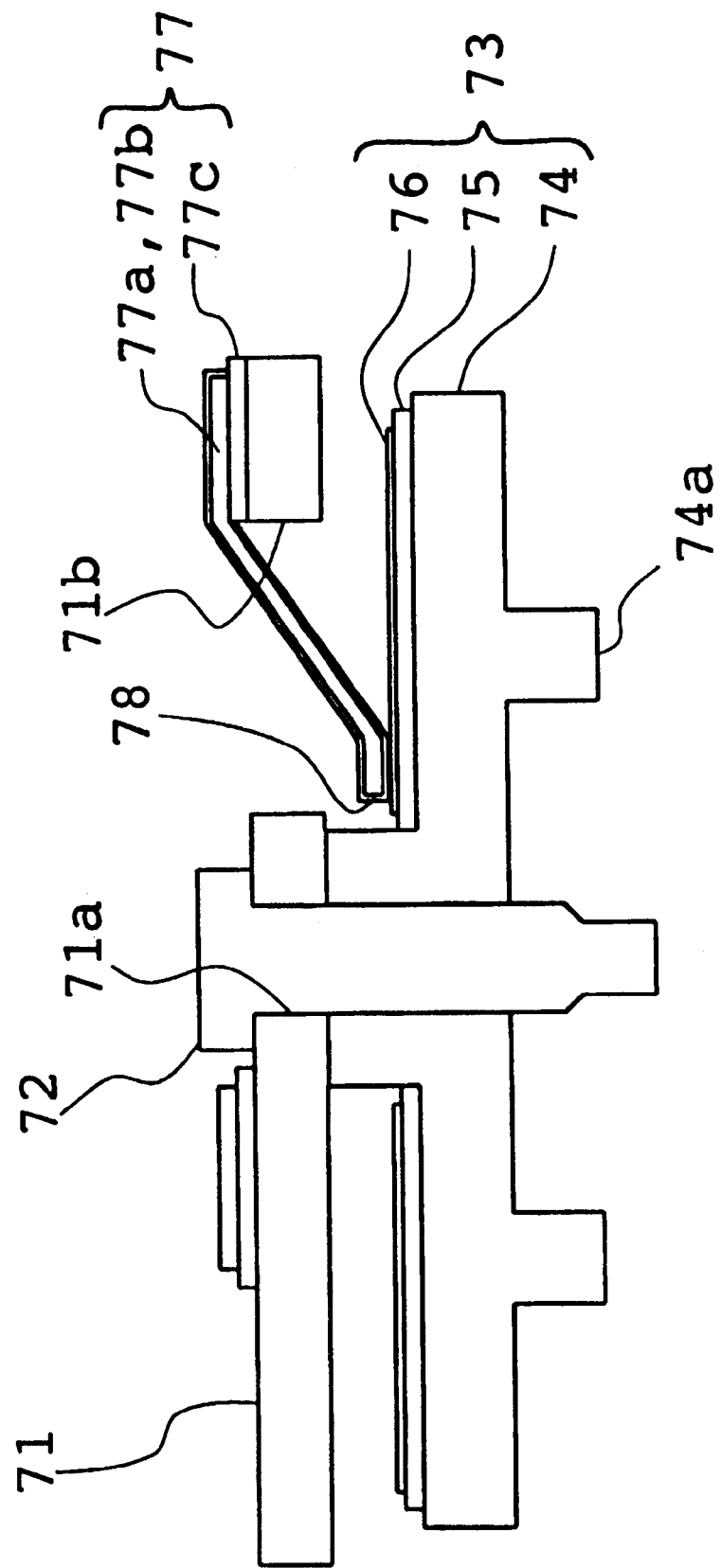
FIG. 7 is a schematic diagram showing a sectional structure of a piezoelectric actuator according to a conventional technique.

FIG. 4 and FIG. 5 are block diagrams showing the supply of the melt material and the melting step.

In a step of immersing a melt material 48 in a fusing agent 44, and supplying it to a transfer plate (FIG. 4(A)), the melt material 48 and the fusing agent 44 are supplied to a transfer plate 45, while applying the fusing agent 44 adjusted in viscosity such that the melt material 48 is properly dispersed by a dispenser 42, to thereby adjust or align the quantity of melt material 48 with a squeegee 43. More specifically, a quantity of the melt material 48 and the fusing agent 44 are supplied into a recess 45a formed in a surface portion of the transfer plate 45. Thereafter, the proper quantity of the melt material 48 can be transferred to a transfer tool 46, by immersing a portion 46a of the transfer tool 46 into the recess 45a of transfer plate 45. Then, the melt material 48 and the fusing agent 44 are supplied to the lead wire 7 (FIG. 4(B)). Moreover, the melt material 48 can be formed in a substantially spherical shape, by heating the melt material 48 and the fusing agent 44 supplied to the lead wire 7 with an infrared ray lamp 49 (FIG. 4(C)). Here, the melt material 48 and the fusing agent 44 may be mixed in advance before being supplied to the transfer plate 45, or after the melt material 48 is supplied to the transfer plate 45, the fusing agent 44 may be supplied by the dispenser. Therefore, the quantity of the melt material 48 determined by the viscosity of the fusing agent 44 and the shape of the transfer tool 46 can be transferred with good repeatability, and particularly, it has been confirmed that a supply in a minute quantity is possible. It is also suitable when a plurality of melt materials 48 having a minute particle size are supplied to the lead wire 7 to thereby control the supply quantity.

Furthermore, when the melt material 48 and the fusing agent 44 are supplied to the lead wire 7 with the transfer tool 46 (FIG. 5(A)), after a step of press-fitting the support shaft 2 into the oscillating body 3(FIG. 5(B)), the lead wire 7 and the electrode pattern 6 on the piezoelectric element 5 are brought close to each other and heated by a heating tool 51, to thereby weld the lead wire 7 and the electrode pattern 6 and the melt material 8 (FIG. 5(C)). In such a step, the melt material 48 does not fall off in the step of press-fitting the support shaft 2 and the oscillating body 3 because of the viscosity of the fusing agent 44, and the melt material 48 is formed in a substantially spherical shape by heating the lead wire 7, the electrode pattern 6 and the melt material 48 with the heating tool 51. Therefore, there can be omitted a step of welding the lead wire 7 and the melt material 48 using heating means such as an infrared ray lamp or the like, after supplying the melt material 48.

As described above, according to this embodiment, since a melt material in a substantially spherical shape is used for being welded on each material in the joining portion of the electrode on the piezoelectric element and the lead wire, the electrode pattern 6 provided on the piezoelectric element 5 and the conductive wires 7b, 7c secure a proper adhesion strength by means of the melt material 8, and secure a joining area that does not disturb the oscillation of the oscillating body 3, by reducing variations in the size of the melt materials.

Moreover, since steps of supplying the melt material to the lead wire, welding the melt material on the lead wire and welding the melt material on the piezoelectric element are used, falling off of the melt materials 8a, 8b can be prevented during transportation to the next step after the melt materials 8a, 8b are supplied, and in the step of press-fitting the oscillating body 3 into the support shaft 2.

Furthermore, since a melt material is used in a substantially spherical shape, the melt material is hardly affected by variations in the heating conditions.

Also, in the step of supplying the melt material to the lead wire, since a step of immersing the melt material in the fusing agent and supplying it to the transfer plate, a step of transferring the melt material from the transfer plate to the transfer tool, and a step of transferring the melt material from the transfer tool to the lead wire are used, the quantity of the melt material to be transferred is determined by the viscosity of the fusing agent, as a shape matching the shape of the conductive wire, which means that supply of the melt material can be controlled in a minute quantity. This embodiment is suitable for a case where a plurality of melt materials are supplied to a conductive wire, and the supply quantity is controlled. As with the former embodiment, if the melt material is heated on the conductive wire, the plurality of melt materials are melted, enabling welding of the melt material in a substantially spherical shape.

Furthermore, since steps of immersing the melt material in the fusing agent and supplying it to the transfer plate, transferring the melt material and the fusing agent from the transfer plate to the transfer tool, supplying the melt material and the fusing agent from the transfer tool to the lead wire, and welding the melt material on the lead wire and the piezoelectric element are used, minute melt materials can be easily supplied to the lead wire, and the melt material can be formed in a substantially spherical shape by heat due to joining the lead wire and the piezoelectric element.

As described above, according to the present invention, a melt material is disposed between the piezoelectric element and the lead wire, and the size of the melt material is processed in advance in a substantially spherical shape so that the oscillation characteristic is not suppressed, thereby enabling control of the joining area. Therefore, in the step of joining the piezoelectric element and the lead wire, control of the supply quantity of the melt material becomes easy, and a proper adhesion strength can be secured, enabling improvement in the yield rate.

What is claimed is:

1. A method of manufacturing a piezoelectric actuator, comprising steps of:
   providing a piezoelectric element and a lead wire for supplying a drive signal to the piezoelectric element;
   immersing a melt material into a fusing agent;
   supplying a quantity of the melt material and the fusing agent to a transfer plate;
   adjusting the quantity of the melt material and the fusing agent on the transfer plate;
   transferring a preselected quantity of the melt material and the fusing agent from the transfer plate to a transfer tool;
   supplying the preselected quantity of the melt material and the fusing agent from the transfer tool to the lead wire;
   welding the melt material on the lead wire; and
   welding the melt material on the piezoelectric element to thereby connect the lead wire to the piezoelectric element.

2. A method of manufacturing a piezoelectric actuator, comprising steps of:
   providing a piezoelectric element and a lead wire for supplying a drive signal to the piezoelectric element;
   immersing a melt material into a fusing agent;
   supplying the melt material and the fusing agent to a transfer plate;
   transferring the melt material and the fusing agent from the transfer plate to a transfer tool;
   supplying the melt material and the fusing agent from the transfer tool to the lead wire; and
   welding the melt material on the lead wire and the piezoelectric element using a heating device to thereby connect the lead wire to the piezoelectric element.

3. A method of manufacturing a piezoelectric actuator according to claim 1; wherein the melt material is generally spherical-shaped.

4. A method of manufacturing a piezoelectric it actuator according to claim 3; wherein the adjusting step is carried out using a squeegee.

5. A method of manufacturing a piezoelectric actuator according to claim 1; wherein the adjusting step is carried out using a squeegee.

6. A method of manufacturing a piezoelectric actuator according to claim 1; wherein the adjusting step is carried out by moving a squeegee across a portion of the transfer plate on which the melt material and the fusing agent is supplied.

7. A method of manufacturing a piezoelectric actuator according to claim 1; wherein the transfer tool has a portion on which the preselected quantity of the melt material and the fusing agent is supplied; and wherein the transfer plate has a recess formed in a surface thereof into which the quantity of the melt material and the fusing agent is supplied and from which the preselected quantity of melt material and fusing agent transferred to the portion of the transfer tool is obtained.

8. A method of manufacturing a piezoelectric actuator according to claim 7; wherein the preselected quantity of the melt material and the fusing agent is determined by a size of the portion of the tool and a depth of the recess in the surface of the transfer plate.

9. A method of manufacturing a piezoelectric actuator according to claim 7; wherein the adjusting step is carried out by moving a squeegee across the recess in the surface of the transfer plate.

10. In a method of manufacturing a piezoelectric actuator having a piezoelectric element having an electrode pattern, and a lead wire for supplying a drive signal to the piezoelectric element, a method of joining the lead wire to the electrode pattern of the piezoelectric element, comprising the steps of:
    immersing a melt material into a fusing agent;
    supplying a quantity of the melt material and the fusing agent to a transfer plate;
    transferring the melt material and the fusing agent from the transfer plate to a transfer tool;
    supplying the melt material and the fusing agent from the transfer tool to the lead wire; and
    welding the melt material on the lead wire and on the electrode pattern of the piezoelectric element to thereby join the lead wire to the electrode pattern.

11. A method according to claim 10; wherein the melt material is generally spherical-shaped.

12. A method according to claim 11; wherein the step of supplying the quantity of the melt material and the fusing agent to the transfer plate includes the step of adjusting the quantity of the melt material and the fusing agent on the transfer plate.

13. A method according to claim 12; wherein the adjusting step is carried out using a squeegee.

14. A method according to claim 10; wherein the step of supplying the quantity of the melt material and the fusing agent to the transfer plate includes the step of adjusting the quantity of the melt material and the fusing agent on the transfer plate.

15. A method according to claim 14; wherein the adjusting step is carried out using a squeegee.

16. A method according to claim 10; wherein the welding step comprises bringing the lead wire and the electrode pattern close to one another and applying heat using a heating device to weld the melt material on the lead wire and the electrode pattern.

17. A method of manufacturing a piezoelectric actuator, comprising the steps of:

providing a support member having a support shaft;

providing an oscillating body having a resilient member, a piezoelectric element mounted on the resilient member, and an electrode pattern disposed on the piezoelectric element;

connecting to the support member a lead wire for supplying a drive signal to the piezoelectric element;

press-fitting the support shaft of the support member in a through-hole formed in the resilient member of the oscillating body;

immersing a melt material into a fusing agent;

supplying a quantity of the melt material and the fusing agent to a transfer plate;

transferring the melt material and the fusing agent from the transfer plate to a transfer tool;

supplying the melt material and the fusing agent from the transfer tool to the lead wire; and welding the melt material on the lead wire and on the electrode pattern of the piezoelectric element to thereby join the lead wire to the piezoelectric element.

18. A method according to claim 17; wherein the melt material is generally spherical-shaped.

19. A method according to claim 18; wherein the step of supplying the quantity of the melt material and the fusing agent to the transfer plate includes the step of adjusting the quantity of the melt material and the fusing agent on the transfer plate.

20. A method according to claim 19; wherein the adjusting step is carried out using a squeegee.

21. A method according to claim 17; wherein the step of supplying the quantity of the melt material and the fusing agent to the transfer plate includes the step of adjusting the quantity of the melt material and the fusing agent on the transfer plate.

22. A method according to claim 21; wherein the adjusting step is carried out using a squeegee.

23. A method according to claim 17; wherein the welding step comprises bringing the lead wire and the electrode pattern close to one another and applying heat using a heating device to weld the melt material on the lead wire and the electrode pattern.

* * * * *